US010389092B2

(12) United States Patent
Matsumoto

(10) Patent No.: US 10,389,092 B2
(45) Date of Patent: Aug. 20, 2019

(54) FRAME ASSEMBLY BODY AND CASING

(71) Applicant: Mitsubishi Electric Corporation, Chiyoda-ku, Tokyo (JP)

(72) Inventor: Takemi Matsumoto, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/563,642

(22) PCT Filed: Apr. 15, 2016

(86) PCT No.: PCT/JP2016/062108
§ 371 (c)(1),
(2) Date: Oct. 2, 2017

(87) PCT Pub. No.: WO2016/181759
PCT Pub. Date: Nov. 17, 2016

(65) Prior Publication Data

US 2018/0066691 A1 Mar. 8, 2018

(30) Foreign Application Priority Data

May 8, 2015 (JP) ................................ 2015-095294

(51) Int. Cl.
*H02B 1/01* (2006.01)
*H05K 7/18* (2006.01)
(Continued)

(52) U.S. Cl.
CPC ......... *H02B 1/014* (2013.01); *A47B 47/0058* (2013.01); *A47B 47/027* (2013.01);
(Continued)

(58) Field of Classification Search
CPC ........... F16B 12/50; H02B 1/014; H02B 1/01; H05K 7/18
See application file for complete search history.

(56) References Cited

U.S. PATENT DOCUMENTS

2014/0105674 A1 4/2014 Hayashi et al.

FOREIGN PATENT DOCUMENTS

DE 1779089 * 6/1972 ........... A47B 47/021
DE 150846 A1 * 9/1981 ............. A47B 96/14
(Continued)

OTHER PUBLICATIONS

Office Action (Notification of Reasons for Refusal) dated Feb. 20, 2018, by the Japanese Patent Office in corresponding Japanese Patent Application No. 2017-517843 and English translation of the Office Action. (6 pages).
(Continued)

*Primary Examiner* — Michael Safavi
(74) *Attorney, Agent, or Firm* — Buchanan Ingersoll & Rooney PC

(57) ABSTRACT

A frame assembly body includes a connected section in which one ends of first and second frame materials, each of which has plural bent sections and plural surfaces, are joined perpendicularly. The connected section has: a projected piece locking section in which a slit-shaped fitting hole, a notch, or a recessed section formed in the second frame material is fitted to a projected piece provided in the first frame material; and a slit fitted section in which a slit-shaped notch formed in the second frame material is fitted to a fitting slit formed in a manner to notch the first frame material.

9 Claims, 8 Drawing Sheets

(51) Int. Cl.

| | |
|---|---|
| ***A47B 47/00*** | (2006.01) |
| ***A47B 47/02*** | (2006.01) |
| ***A47B 96/14*** | (2006.01) |
| *F16B 12/50* | (2006.01) |

(52) U.S. Cl.
CPC .......... *A47B 96/14* (2013.01); *A47B 96/1441* (2013.01); *H02B 1/01* (2013.01); *H05K 7/18* (2013.01); *F16B 12/50* (2013.01)

(56) References Cited

FOREIGN PATENT DOCUMENTS

| | | | | |
|---|---|---|---|---|
| DE | 8202245 | U1 * | 6/1982 | .............. F16B 12/50 |
| JP | 56-026087 | Y2 | 6/1981 | |
| JP | S-56-026089 | Y2 | 6/1981 | |
| JP | H11-221124 | A | 8/1999 | |
| JP | 2001-307697 | A | 11/2001 | |
| JP | 2003-071105 | A | 3/2003 | |
| JP | 2005-226677 | A | 8/2005 | |
| JP | 2011-061981 | A | 3/2011 | |
| WO | WO 2012/173087 | A1 | 12/2012 | |

OTHER PUBLICATIONS

International Search Report (PCT/ISA/210) dated Jun. 21, 2016, by the Japanese Patent Office as the International Searching Authority for International Application No. PCT/JP2016/062108.

Written Opinion (PCT/ISA/237) dated Jun. 21, 2016, by the Japanese Patent Office as the International Searching Authority for International Application No. PCT/JP2016/062108.

Office Action (Notification of Reasons for Refusal) dated Jul. 24, 2018, by the Japanese Patent Office in corresponding Japanese Patent Application No. 2017-517843 and English translation of the Office Action. (6 pages).

Office Action dated Jul. 2, 2018, by the German Patent Office in corresponding Greman Patent Application No. 11 2016 002 098.8 and English translation of the Office Action. (6 pages).

Office Action dated Sep. 5, 2018, by the Chinese Patent Office in corresponding Chinese Patent Application No. 201680016732. 7 and English translation of the Office Action. (10 pages).

* cited by examiner

FRAME ASSEMBLY BODY AND CASING

TECHNICAL FIELD

The invention relates to a frame assembly body and a casing for which the frame assembly body is used, the frame assembly body being preferably used as a framework of the casing for a switchboard or the like, for example.

BACKGROUND ART

Conventionally, a structure of welding and joining ends of frame materials has widely been adopted for an assembly of a structural object with a hexahedral frame. However, the assembly of the structural object by welding leads to such problems that an assembly worker is limited to a license holder and that long time is required for repair work due to significant post-assembly deformation caused by welding. To handle these problems, a structure of adding a member that couples the frame materials to a corner of the hexahedral frame and fastening the frame materials by a bolt or a rivet to obtain required strength has been disclosed (for example, see PTL 1, 2). In addition, a structure of fastening the frame materials by the bolt or the rivet without using the member that couples the frame materials has been disclosed (for example, see PTL 3).

CITATION LIST

Patent Literature

[PTL 1] JP-A-2001-307697
[PTL 2] JP-A-2005-226677
[PTL 3] JP-A-2011-61981

DISCLOSURE OF INVENTION

Technical Problem

Welding work is not performed in the technique as disclosed in PTL 1. However, in order to secure the strength of the entire frame, a member that couples the frames is required at the eight corners of the frame body. In addition, the three coupling members are required per corner. Thus, there are problems of increased part cost and increased assembly time due to 48 times of fastening work using the bolts or the rivets at all the corners.

Meanwhile, similar to the technique in PTL 1, the welding work is not performed in a technique as disclosed in PTL 2. However, in order to secure the strength of the entire frame, a coupling member that couples the frames and that has a complicated three-dimensional shape is required at a total of the eight corners of the frame body. In addition, although the number of the used members is reduced due to the one member being used per corner, the fastening work using the bolts or the rivets has to be performed at 12 positions per corner. Accordingly, the work has to be performed at 96 positions for the all corners. Thus, similar to the technique in PTL 1, the assembly time is increased.

Furthermore, in regard to a structural object realized by fastening as in PTL 3, the welding work is not performed, and such an effect that the strength of the corner can be improved is obtained. However, a shape of the member coupling the frame materials is complicated. In addition, the fastening work using the bolt or the rivet has to be performed at 20 positions per corner, that is, 160 positions for the all corners. Thus, similar to the techniques in PTL 2 and 3, there is a problem of the increased assembly time.

The invention has been made to solve the problems as described above, and therefore has a purpose of providing a frame assembly body and a casing capable of eliminating welding work and a coupling member that couples frame materials and has a complicated three-dimensional shape, capable of being assembled easily by reducing the number of fastened sections by bolts, rivets, or the like, and capable of securing sufficient strength.

Solution to Problem

A frame assembly body according to the invention is a frame assembly body that includes a first frame material and a second frame material, each of which has a shape that a plate material is bent along a periphery of a square column, has plural bent sections and plural surfaces continuing from the bent section, and that has a connected section in which one ends of the first frame material and the second frame material are joined perpendicularly. The connected section has: a projected piece locking section in which a slit-shaped fitting hole, a notch, or a recessed section formed in the second frame material is fitted to a projected piece provided on the surface of the first frame material; and a slit fitted section in which a slit-shaped notch formed in the second frame material is fitted to a fitting slit formed in a manner to notch the first frame material.

Advantageous Effects of Invention

According to the invention, the connected section in which the ends of the two frame materials are joined perpendicularly has: the projected piece locking section in which the slit-shaped fitting hole, the notch, or the recessed section formed in the second frame material is fitted to the projected piece provided in the first frame material; and the slit fitted section in which the slit-shaped notch formed in the second frame material is fitted to the fitting slit formed in the manner to notch the first frame material. Accordingly, the frame assembly body and a casing that can easily be assembled without welding work or a coupling member in a complicated shape for coupling the frame materials to each other, for which the number of fastening tools, such as a bolt or a rivet, is reduced, and that secure sufficient strength can be obtained.

A purpose, a characteristic, a perspective, and an effect of the invention other than those described above will become apparent from the detailed description of the invention, which will be made below with reference to the drawings.

MODES FOR CARRYING OUT THE INVENTION

First Embodiment

Figure 1:
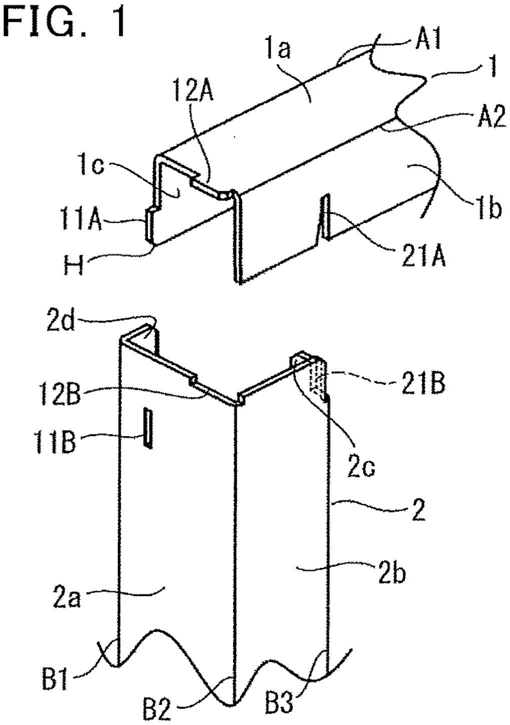
FIG. 1 is a perspective view of a projected piece and a fitting hole as well as a notch and a fitting slit provided in a connected section of two frame materials at a corner of a frame assembly body according to a first embodiment of the invention.
Figure 2:
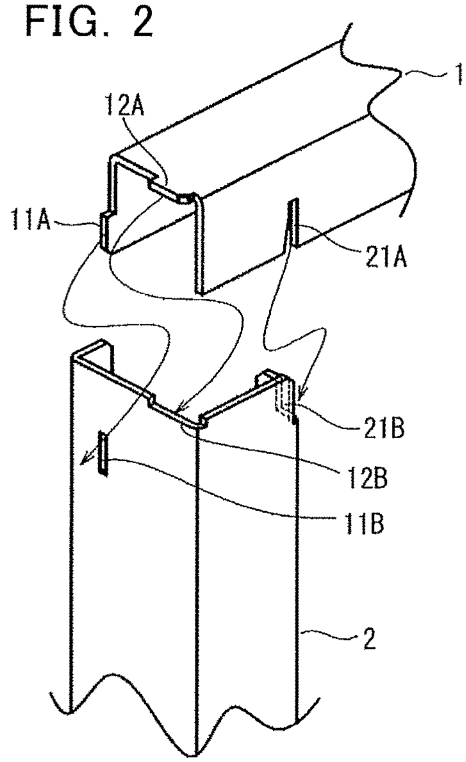
FIG. 2 is a perspective view that illustrates fitting positions of the two frame materials of the frame assembly body according to the first embodiment of the invention at a time when the two frame materials are connected.
Figure 3:
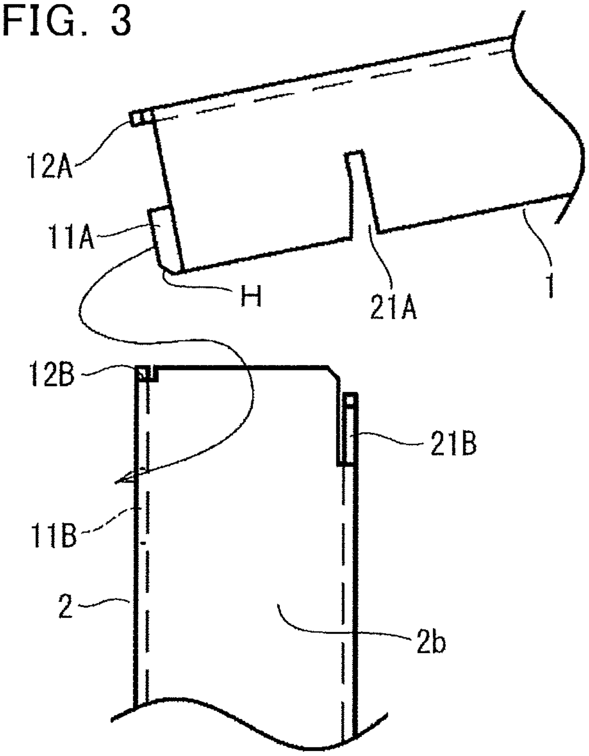
FIG. 3 is a side view that illustrates an operation at the time when the two frame materials of the frame assembly body according to the first embodiment of the invention are connected.

FIG. 1 is a perspective view of a projected piece and a fitting hole as well as a notch and a fitting slit provided in a connected section of two frame materials at a corner of a frame assembly body according to a first embodiment of the invention, FIG. 2 is a perspective view that illustrates fitting positions of the two frame materials to each other at a time when the two frame materials depicted in FIG. 1 are connected, and FIG. 3 is a side view that illustrates an operation at the time when the two frame materials depicted in FIG. 1 are connected. Note that, in this first embodiment, a description will be centered on a structure of the connected section constructed at a corner of a rectangle in the frame assembly body that includes a rectangular frame (framework) formed by joining ends of four frame materials perpendicularly. Note that the same or corresponding members or portions in each of the drawings are denoted by the same reference sign for the description.

A frame material 1 in a lateral direction (horizontal direction) as a first frame material and a frame material 2 in a vertical direction (up-down direction) as a second frame material, both of which are used for the frame assembly body, are each a rod-shaped or a column-shaped structural material that has: bent sections that are formed by sequentially bending a plate material perpendicularly along a periphery of a square column; and plural surfaces that continue from the bend sections, and are each specifically formed by bending a steel sheet as the material twice or three times by a press brake. The frame material 1 is formed to have two bent sections A1, A2 and three surfaces that continue from the bent sections A1, A2. Note that, for convenience of the description, a central surface of the three surfaces will be referred to as a "primary surface 1*a*", and one of the two opposing surfaces and the other thereof will respectively be referred to as an "opposing surface 1*b*" and an "opposing surface 1*c*".

In addition, the frame material 2 is formed to have three bent sections B1, B2, B3 and four surfaces that continue from the bent sections B1, B2, B3. For convenience of the description, in particular, one of the two surfaces that hold the central bent section B2 therebetween and that are orthogonal to each other and the other thereof will respectively be referred to as a "first primary surface 2*a*" and a "second primary surface 2*b*". The surface that opposes the first primary surface 2*a* and the surface that opposes the second primary surface 2*b* will respectively be referred to as an "opposing surface 2*c*" and an "opposing surface 2*d*".

In this specification, of end surfaces on both sides that are orthogonal to the bent sections of each of the frame materials, the end surface on one end side with a connected section will be referred to as a "longitudinal end surface" without being denoted by the reference sign. However, the longitudinal end surface of the frame material 2 that is arranged in the up-down direction will be referred to as an "upper end surface" without being denoted by the reference sign. In addition, end surfaces that are parallel to the bent sections of each of the frame materials will each be referred to as a "lateral end surface" without being denoted by the reference sign. Furthermore, in this specification, a portion that is simply referred to as the "surface", the "primary surface", or the "opposing surface" does not only indicate the surface of the plate material constituting the frame material, but also indicates an entire portion from a front surface to a back surface that has the surface. Note that mutually opposing sides of the four surfaces of the frame material 2 will be referred to as the back surfaces.

Here, it is configured that the primary surface 1*a* (more precisely, an outer dimension between the above-described opposing surfaces 1*b*, 1*c*) of the frame material 1 in this first embodiment is formed to have narrower width than an inner dimension between the second primary surface 2*b* and the opposing surface 2*d*, which are formed on the back surface side of the first primary surface 2*a* of the frame material 2, by a specified dimension, that one longitudinal end of the frame material 1 is inserted in the back surface side of the first primary surface 2*a* at one end of the frame material 2, and that, of the opposing surfaces 1*b*, 1*c* of the frame material 1, the opposing surface 1*b* on a front side in the drawing abuts against and is fixed to aback surface side of the second primary surface 2*b* of the frame material 2.

In the frame material 1, a projected piece 11A is projected from the lateral end surface side (a lower side in the drawing) of a longitudinal end surface of the opposing surface 1*c* on a back side in the drawing in a manner to oppose the first primary surface 2*a* of the frame material 2, and a second projected piece 12A is projected in the same direction from a longitudinal end surface of the primary surface 1*a*. In addition, the opposing surface 1*b* on the front side is provided with a fitting slit 21A at a specified position that is located slightly inside of the longitudinal end surface, the fitting slit 21A being formed by notching the lateral end surface in a slit shape at a right angle. An opening side of the fitting slit 21A is widened in a tapered shape in a direction toward the longitudinal end surface. Note that the projected piece 11A is uniformly provided with the opposing surface 1*c* on the back side in the drawing, and a tip side of a corner H on a lower side of the projected piece 11A in the drawing is diagonally cut so as to allow insertion thereof in a fitting hole 11B from above obliquely. The projected piece 12A is uniformly provided with the primary surface 1*a*.

Meanwhile, the frame material 2 is provided with the slit-shaped fitting hole 11B, to which the projected piece 11A is fitted, and which is formed of a rectangular hole, at a specified position on the first primary surface 2*a*, and is also provided with a recessed section 12B, with which the projected piece 12A is engaged, and which is formed of a step formed by lowering an upper end surface of the first primary surface 2*a*, which is in contact with the bent section B2, by one step.

Furthermore, on the opposing surface 2*c*, which opposes the first primary surface 2*a*, a notch 21B is provided at a position near the bent section B3 between the opposing surface 2*c* and the second primary surface 2*b*, the notch 21B being notched in a slit shape from an upper end surface of the opposing surface 2*c* in a downward direction of the drawing so as to be engaged with the fitting slit 21A. Note that the upper end surface of the opposing surface 2C is formed to be lower than the upper end surface of the second primary surface 2*b* by plate thickness of the frame material 1.

Next, a description will be made on a connecting method of the frame material 1 and the frame material 2 with reference to FIG. 2 and FIG. 3. Note that curved arrows in FIG. 2 respectively indicate that the projected piece 11A of the frame material 1 is fitted to the fitting hole 11B of the frame material 2, that the projected piece 12A of the frame material 1 is engaged with the recessed section 12B of the frame material 2, and that the fitting slit 21A of the frame material 1 is fitted to the notch 21B of the frame material 2.

First, as depicted in FIG. 3, the frame material 1 is brought into a tilted state where one end side (left side) thereof is located below and the other end side thereof is located above, and the projected piece 11A of the frame material 1 is inserted obliquely from above in and hitched to the fitting hole 11B, which is provided on the first primary surface 2*a* of the frame material 2. Then, the fitting slit 21A of the frame material 1 is rotated about a fitted section of the projected piece 11A and the fitting hole 11B in a clockwise direction of the drawing, so as to slide from a tapered portion thereof on the notch 21B of the frame material 2. In this way, the fitting slit 21A is fitted to the notch 21B. At this time, fitting may be achieved by lightly hitting the frame material 1 with a hummer or the like.

Figure 4:
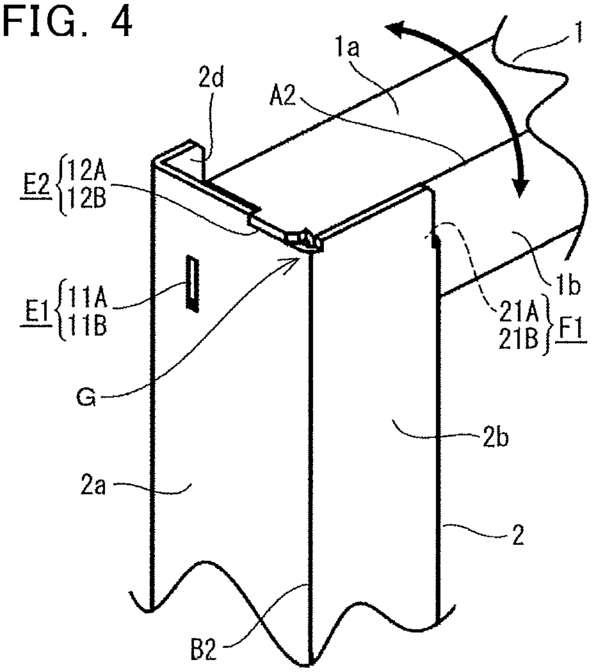
FIG. 4 is a perspective view that illustrates a joined state of the connected section at the time when the two frame materials of the frame assembly body according to the first embodiment of the invention are connected.
Figure 5:
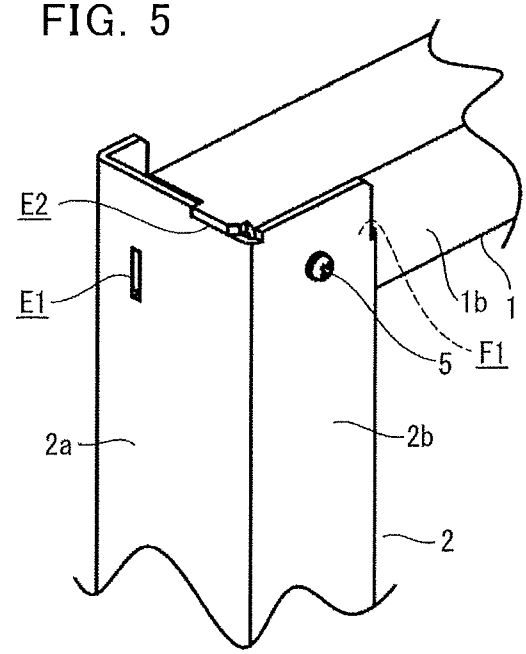
FIG. 5 is a perspective view of a fixed state where the connected sections of the two frame materials of the frame assembly body according to the first embodiment of the invention are fastened by a screw.

FIG. 4 is a perspective view that illustrates a joined state of a connected section at a time when the two frame materials depicted in FIG. 1 are connected, and FIG. 5 is a perspective view of a fixed state where the connected section of the two frame materials depicted in FIG. 4 is fastened by a screw. As depicted in FIG. 4, in the connected section of the frame material 1 and the frame material 2 connected as described above, a locking state in a projected piece locking section E1 is configured by fitting of the projected piece 11A of the frame material 1 to the fitting hole 11B of the frame material 2, a locking state in a projected piece locking section E2 is configured by fitting of the projected piece 12A of the frame material 1 to the recessed section 12B of the frame material 2, and a locking state in a slit fitting section F1 is configured by fitting of the fitting slit 21A of the frame material 1 to the notch 21B of the frame material 2.

As described above, fitting in the projected piece locking section E1 and that in the slit fitting section F1 prevent removal of the frame material 1 from the frame material 2 in a perpendicular direction. In addition, the engagement in the projected piece locking section E2 and that in slit fitting section F1 prevent rotation of the frame material 1 with respect to the frame material 2, which occurs within the primary surface 1*a* in a direction indicated by a double-headed arrow, and thereby prevent the removal of the frame material 1 from the frame material 2.

In addition, in the connected section that is configured by adopting a fitting structure as described above, a width dimension of the hole or the slit, to which each of the frame materials is fitted, is set to have a circumferential clearance of approximately 0.1 mm from thickness of the materials to be processed. In this way, the materials can be processed by a general-purpose machine, such as a turret punch press, without use of a special processing machine. At the same time, it is needless to say that the frame materials cannot be fitted to each other without provision of the clearances. When the clearances in the dimensions as described above are provided, assemblability is not hindered, and rattling of the frame materials after fitting can be minimized.

FIG. 5 depicts the fixed state after the connected section, in which the one ends of the frame material 1 and the frame material 2 are fitted to each other as depicted in FIG. 4, is lastly fastened by a screw 5 as a fastening tool. Note that a screw hole provided in the frame material 1 and an insertion hole for a shaft section of the screw 5 provided in the frame material 2 can be processed later but are preferably provided in advance at specified positions. Note that, also in the other embodiments, the screw hole and the insertion hole described above are provided in advance in specified sections of the frame materials but are not depicted for simplification.

Note that, when the connected section is applied to the rectangular frame assembly body, a decent effect can be exerted by using the connected section only at one of four corners, and structures of the connected sections at the other three are not particularly limited. However, in order to maximize the effect that can be exerted by application of the invention, such a connected section is desirably applied to all the four corners of a rectangular shape.

In this case, two each of the frame material 1 and the frame material 2 are used, and the four corners are sequentially fitted to assemble a rectangular frame. In regard to the last fourth corner to be fitted, because the three corners are already joined by fitting, the frame material 1 is brought into a state where the right side thereof is tilted downward as opposed to that depicted in FIG. 3, for example. Accordingly, an angular relationship between the frame material 1 and the frame material 2 cannot be brought into the state depicted in FIG. 3.

However, each of the three connected sections, which are already joined by fitting, slightly rattles in a state before being fastened by the screw 5. Accordingly, when explained by using FIG. 3, for example, the width of the fitting slit 21A in the frame material 1 is increased in one end direction (left direction in FIG. 3) until a dimension from a left end of the fitting slit 21A to a tip of the projected piece 11A becomes smaller than the inner dimension between the first primary surface 2*a* and the opposing surface 2*c* of the frame material 2. In this way, the frame material 1 is inserted in the frame material 2 almost perpendicularly in the downward direction of the drawing, and the fitting slit 21A can thereby be fitted to the notch 21B. Note that tapering no longer has to be performed. Thereafter, the frame material 1 is moved in the left direction of the drawing, the projected piece 11A is horizontally fitted to the fitting hole 11B, which is provided in the first primary surface 2*a*, and the projected piece 12A is engaged with the recessed section 12B of the frame material 2.

At this time, a clearance in the substantially same dimension as a projected dimension of the projected piece 11A is formed between the left end of the fitting slit 21A in FIG. 3 and the back surface side of the opposing surface 2*c*. Accordingly, for example, a wedge-shaped plate material (not depicted) that is formed to be longer than the fitting slit 21A, and thickness of which fills the clearance, is inserted upward from below in the clearance on the back surface side of the opposing surface 2*c*, and the plate material is then screwed from a front side of the opposing surface 2*c* or the second primary surface 2*b*. In this way, joining can be achieved by fitting with a similar effect to the connected section depicted in FIG. 1 to FIG. 5.

Note that, while the connecting method is not necessarily limited thereto, additional members to be prepared in this method are only the wedge-shaped plate material, which fills the clearance, and a fixing screw. Thus, cost and time required for the assembly can be kept down. The frame assembly body in the rectangular frame shape, which is assembled as described above, can be used as a framework of a signboard, a billboard, a road sign, or the like that is placed in an indoor or outdoor environment, for example. However, application thereof is not particularly limited. In addition, a rivet or the like may be used instead of the screw.

As described above, in the first embodiment, the frame materials 1, 2 are joined to each other perpendicularly through combinations of the projected piece locking sections E1, E2, which are achieved by the projected piece 11A and the slit-shaped fitting hole 11B as well as the projected piece 12A and the recessed section 12B, and the slit fitting section F1, which is achieved by the fitting slit 21A and the slit-shaped notch 21B, at the longitudinal ends of the two frame materials 1, 2 constituting the at least one corner of the frame assembly body.

In the connected section where both of the frame materials 1, 2 are fitted to each other, of three edges, two each of which are orthogonal to each other, and which constitute a corner G (depicted in FIG. 4) of the connected section, the bent section A2 of the one frame material 1 and the bent section B2 of the other frame material 2 exist in two edge portions. Two surfaces of the primary surface 1*a* and the opposing surface 1*b*, each of which continues from the bent section A2, as well as the first primary surface 2*a* and the second primary surface 2*b*, each of which continues from the bent section B2, contribute to the configuration of the connected section. The opposing surface 1*b* and the second primary surface 2*b* are in an overlapping state.

According to the above first embodiment, welding work and a coupling member in a complicated three-dimensional shape, which couples the frame materials, can be eliminated, and the number of fastened sections using a bolt, the rivet, or the like is reduced. Thus, assembly work is facilitated, and the frame assembly body, for which sufficient strength is secured, can be obtained. In addition, a temporary assembly of the frame materials is completed by adopting the fitting structure, and necessary and sufficient strength of the connected section can be secured by the fitting structure. Thus, the number of the fastening tools, such as the screws, can be minimized to such extent that the materials are removed and eventual rattling is suppressed.

Because the fastening positions can be reduced, required work time for the assembly can be shortened. Because all the frame materials can be assembled by fitting, temporal assembly work and fastening work using the bolt or the rivet can be performed in completely separate processes. Thus, work efficiency can be promoted. Because the required member other than the frame materials is only the wedge-shaped plate material for the rectangular frame assembly body using the four frame materials. Thus, the cost and the time required for the assembly are too low and short to be problematic. Because welding is unnecessary, the frame assembly body can easily be assembled regardless of a selected worker. The frame materials can be processed by the general-purpose machine, such as the turret punch press, without the use of the special processing machine.

Second Embodiment

Figure 6:
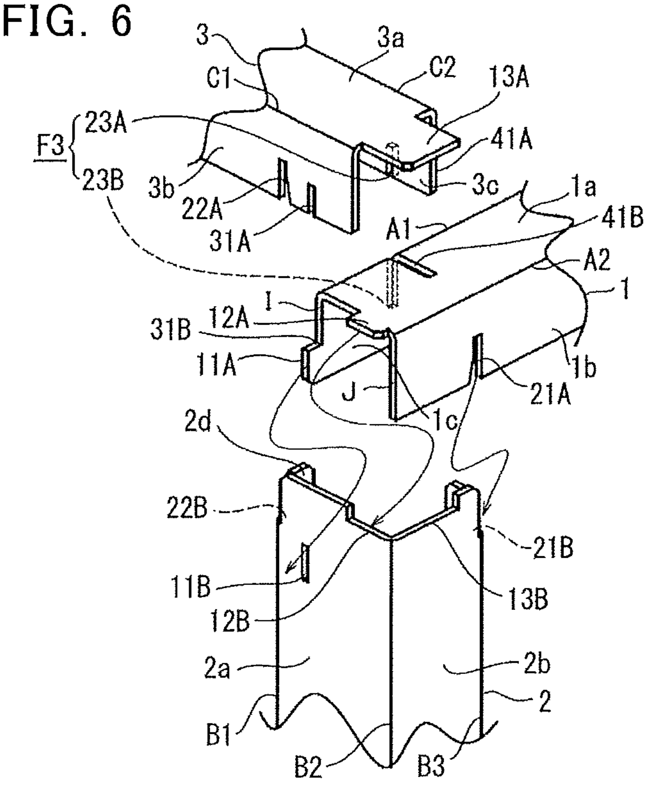
FIG. 6 is a perspective view of a projected piece locking section and a slit fitting section provided in a connected section of three frame materials at a corner of a frame assembly body according to a second embodiment of the invention.
Figure 7:
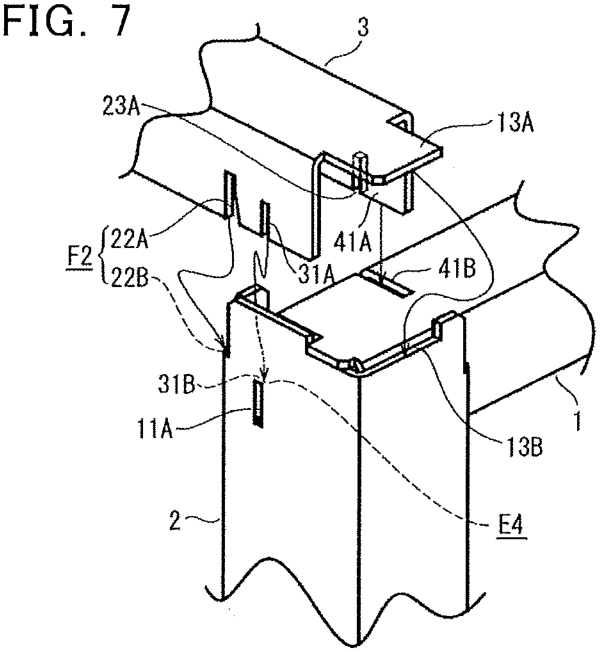
FIG. 7 is a perspective view that illustrates an operation at a time when the three frame materials of the frame assembly body according to the second embodiment of the invention are connected.
Figure 8:
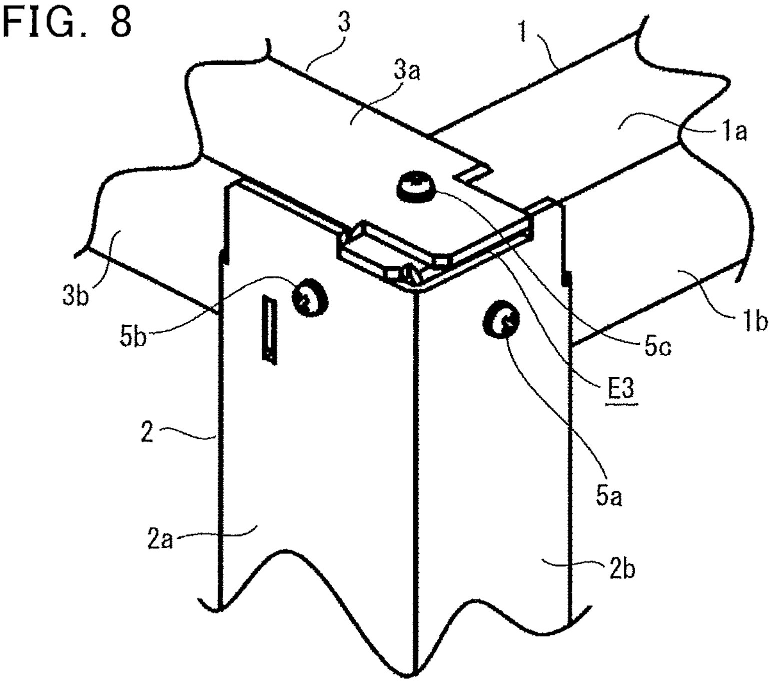
FIG. 8 is a perspective view of a fixed state where a three-way connected section, in which the three frame materials of the frame assembly body according to the second embodiment of the invention are connected, is fastened by screws.

FIG. 6 is a perspective view of a projected piece locking section and a slit fitting section provided in a connected section of three frame materials at a corner of a frame assembly body according to a second embodiment of the invention, FIG. 7 is a perspective view that illustrates an operation at a time when the three frame materials depicted in FIG. 6 are connected, and FIG. 8 is a perspective view of a fixed state where a three-way connected section, in which the three frame materials depicted in FIG. 7 are connected, is fastened by screws. Note that this second embodiment differs from the first embodiment in a point that the three frame materials are fitted in the connected section at the corner of the frame assembly body in order to obtain a rectangular parallelepiped frame assembly body.

Note that a basic structure, in which the connected section is configured by fitting the frame material 1 in the lateral direction and the frame material 2 in the vertical direction in the drawing to each other to form the rectangular frame shape, is substantially the same as that in the first embodiment. However, some portions thereof are added or changed. Thus, a description of the frame materials 1, 2 will only be made on the added or changed portions. Note that directions such as the lateral direction, the vertical direction, and a front-rear direction are used for convenience of the description and thus are not limited to indicate an actual used state.

In the drawing, a frame material 3 as a third frame material in the front-rear direction is newly added to a connected portion of the frame material 1 in the lateral direction and the frame material 2 in the vertical direction from an orthogonal direction to a plane defined by both of the materials. Similar to the frame material 1, the frame material 3 has a shape that is formed by bending a steel sheet twice by the press brake, and has bent sections C1, C2, a primary surface 3*a*, an opposing surface 3*b*, and an opposing surface 3*c*. Furthermore, the frame material 3 has: two fitting slits 22A, 31A that are formed on a lateral end surface of the opposing surface 3*b*; a fitting slit 23A that is formed on a lateral end surface of the opposing surface 3*c*; and a projected piece 13A that is provided to be projected from a longitudinal end surface of the primary surface 3*a*.

An L-shaped slit 41B is added to the primary surface 1*a* of the frame material 1 and the opposing surface 1*c* on the back side thereof, which continues from the primary surface 1*a* via the bent section A1. The L-shaped slit 41B is provided across the two surfaces, to which an engagement piece 41A formed at an end of the opposing surface 3*c* of the frame material 3 is fitted, and also serves as a notch 23B, to which a fitting slit 23A is fitted, the fitting slit 23A being formed as a notch that is formed adjacently to the other end side of the engagement piece 41A. Note that the fitting slit 23A and the notch 23B constitute a slit fitting section F3.

The frame material 2 has: a notch 22B at a position in the opposing surface 2*d* that is in contact with the bent section B1 continuing from the first primary surface 2*a*, the notch 22B being fitted to the fitting slit 22A on a far side from a longitudinal end surface of the two fitting slits 22A, 31A provided on the lateral end surface of the opposing surface 3*b* in the frame material 3; and a recessed section 13B on the bent section B2 side in the upper end surface of the second primary surface 2*b*, the recessed section 13B being fitted to the projected piece 13A of the frame material 3. A lower surface of the projected piece 13A abuts against an upper surface of the primary surface 1*a* of the frame material 1.

Note that the fitting slit 22A and the notch 22B constitute a slit fitting section F2, and the projected piece 13A and the recessed section 13B constitute a projected piece locking section E3 (depicted in FIG. 8). The fitting slit 31A is provided to be fitted to a projected piece base 31B, which will be described below, on a base side of the projected piece 11A provided in the frame material 1.

An L-shaped end surface I as a portion between the projected piece 11A and the projected piece 12A on the longitudinal end surfaces of the frame material 1 is recessed by plate thickness from an end surface J of the opposing surface 1*b* portion, so as to insert a portion of the opposing surface 3*b* in the frame material 3, which is on one end side with respect to the fitting slit 22A, in a portion between the L-shaped end surface I and the first primary surface 2*a* of the frame material 2. In conjunction with this, the projected piece 11A of the frame material 1 seems to be formed longer than that in the first embodiment. The projected piece 11A constitutes the projected piece locking section E1, and the above-described fitting slit 31A is fitted to the projected piece base 31B as the base thereof. Thus, the projected piece 11A also serves as a projected piece locking section E4 (depicted in FIG. 7).

Next, a description will be made on an assembly with reference to FIG. 7 and FIG. 8. First, the frame material 1 and the frame material 2 are fitted as illustrated in the first embodiment. Then, as depicted in FIG. 7, the frame material 3 slides downward from above. The fitting slit 31A of the frame material 3, the fitting slit 23A of the frame material 3, the fitting slit 22A of the frame material 3, and the projected piece 13A of the frame material 3 are respectively fitted to the projected piece base 31B formed on the base side of the projected piece 11A of the frame material 1, the notch 23B (not depicted in FIG. 7) formed at a lower end of the slit 41B of the frame material 1, the notch 22B of the frame material 2, and the recessed section 13B of the frame material 2.

At this time, the portion of the opposing surface 3*b* in the frame material 3, which is on the one end side of the fitting slit 22A, is inserted between the end surface I of the frame material 1 and the first primary surface 2*a* of the frame material 2. In this way, the ends of the three frame materials including the frame material 1, the frame material 2, and the frame material 3 are fitted, and the three-way connected section with the orthogonal frame materials can thereby be assembled. Note that the rectangular parallelepiped frame assembly body can also be obtained in a similar manner.

Next, as depicted in FIG. 8, the three frame materials are fastened by screws 5*a*, 5*b*, 5*c*. Note that a fastened portion of the screw 5*a* has the same structure as that of the screw 5 in the first embodiment, the screw 5*b* is fastened by an insertion hole provided in the first primary surface 2*a* of the frame material 2 and a screw hole provided in the opposing surface 3*b* of the frame material 3, and the screw 5C is fastened to an insertion hole provided in the primary surface 3*a* of the frame material 3 and a screw hole provided in the primary surface 1*a* of the frame material 1. Similar to the first embodiment, a temporal assembly of the frame materials is completed by adopting a fitting structure, just as described. In this way, required fitting strength can be secured, and the eventual rattling can be suppressed with the minimum number of the screws. The rivets may be used instead of the screws.

As it has been described so far, according to the second embodiment, in the connected section that constitutes the corner of the frame assembly body, the welding work and the coupling member in the complicated three-dimensional shape, which couples the frame materials, can be eliminated. In addition, the three frame materials are fastened without use of a special fastening part, and the frame materials that constitute the frame assembly body are fastened by the minimum number of the screws or the rivets. In this way, the mechanically strong frame assembly body can be obtained. Furthermore, because the number of the fastening tools such as the bolts or the rivets is reduced, the assembly work is facilitated, and the frame assembly body with the necessary and sufficient strength can be obtained.

Third Embodiment

Figure 9:
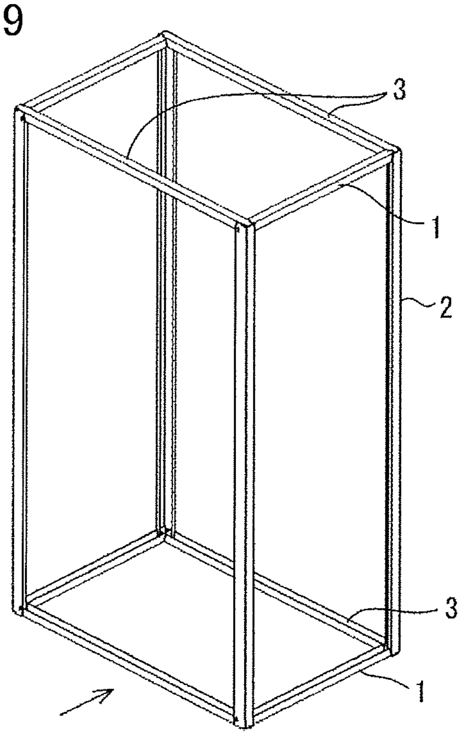
FIG. 9 is a perspective view of a frame assembly body according to a third embodiment of the invention.
Figure 10:
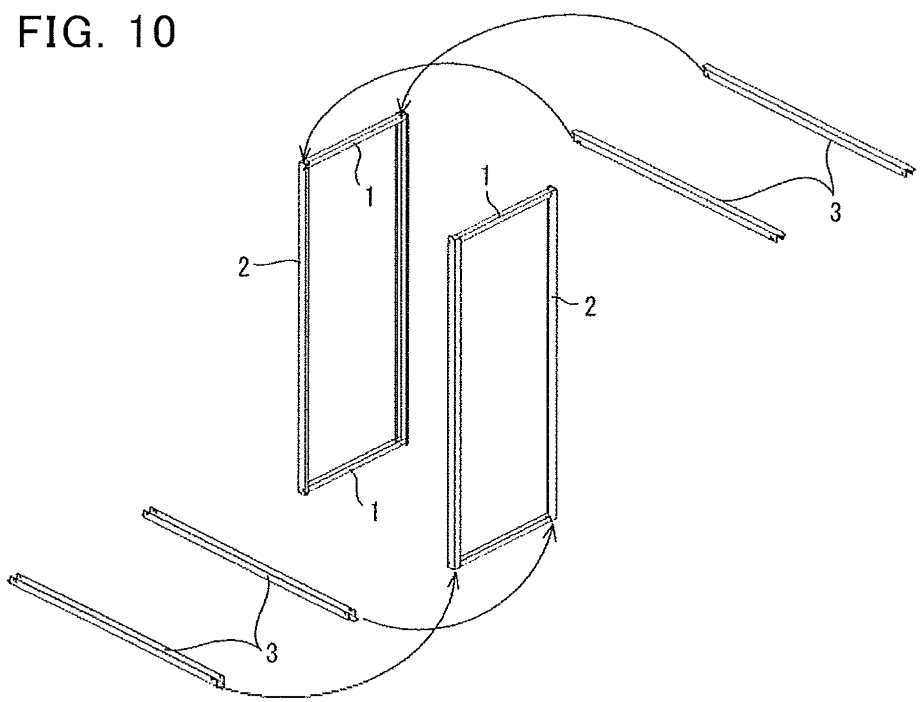
FIG. 10 is an exploded perspective view that illustrates an assembly procedure of the frame assembly body according to the third embodiment of the invention.

FIG. 9 is a perspective view of a frame assembly body according to a third embodiment of the invention, and FIG. 10 is an exploded perspective view that illustrates an assembly procedure of the frame assembly body depicted in FIG. 9. FIG. 9 is a perspective view in which a frame structure 26 according to the third embodiment of the invention is seen obliquely from above. Note that four each of the frame material 1, the frame material 2, and the frame material 3 are used in this third embodiment, and this third embodiment relates to the frame assembly body constructed of a rectangular parallelepiped framework that is produced by using the three-way connected sections, for each of which plural locking means such as the projected piece, the fitting hole, the recessed section, the fitting slit, and the notch described in the second embodiment are used. In FIG. 9, when an arrow direction is set as a direction seen from front, the frame material 1, the frame material 2, and the frame material 3, which constitute the rectangular parallelepiped frame assembly body, are respectively positioned in the front-rear direction, the up-down direction, and a right-left direction.

During an assembly, as depicted in FIG. 10, the two frame materials 1 in the front-rear direction and the two frame materials 2 in the up-down direction are assembled in the rectangular shape by the procedure described in the first embodiment, then two sets thereof are prepared, and inner sides thereof are set to oppose each other. Note that the frame materials in FIG. 8 are disposed in the right-left direction. Thereafter, by the procedure described in the second embodiment, the two frame materials 3 in the right-left direction, each of which is placed on a floor such that the opposing surfaces 3*b*, 3*c* with a U-shaped cross section (depicted in FIG. 6) face upward, are fitted and assembled to corners at a lower end of each of the already-assembled rectangular frame materials.

Thereafter, the two frame materials 3 in the right-left direction are fitted to corners at an upper end thereof in a similar manner. In this way, the frame assembly body constructed of the rectangular parallelepiped framework is completed. Note that, as depicted in FIG. 8, all the eight corners of the frame assembly body are fastened by the minimum number of the screws 5 (5*a* to 5*c*) or the rivets, for example, when necessary. In this way, rattling of the fitted sections can be suppressed, and the frame assembly body can have a robust structure.

As described above, the frame assembly body according to the third embodiment is characterized that a total of 12 frame materials in the up-down direction, the front-rear direction, and the right-left direction, which serve as the framework constituting a hexahedron of a casing, are locked by simply being fitted at a total of 8 corners of the casing, that a structure, in which the connected section has substantially the same strength as that upon completion and can retain a self-standing state, is obtained and that the number of the fastening means for eliminating rattling of the connected sections caused by fitting can be minimized only to the three screws per three-way connected section.

According to the third embodiment that is configured as described so far, the welding work and the special fastening parts such as the coupling member in the complicated three-dimensional shape, which couples the frame materials, can be eliminated. In addition, the frame materials that constitute the frame assembly body are fastened by the minimum number of the screws or the rivets. In this way, the mechanically strong frame assembly body can be obtained. Furthermore, because the number of the fastening tools such as the bolts and the rivets is reduced, the assembly work is facilitated, and the frame assembly body with the necessary and sufficient strength can be obtained.

Fourth Embodiment

Figure 11:
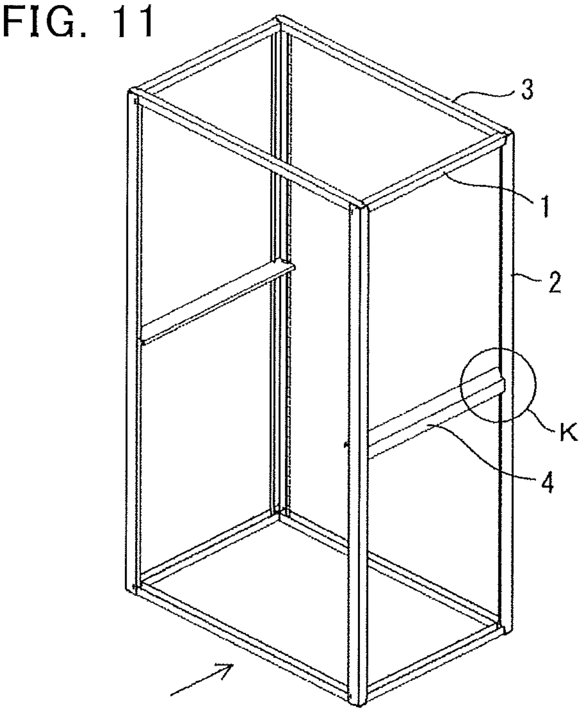
FIG. 11 is a perspective view of a frame assembly body according to a fourth embodiment of the invention.
Figure 12:
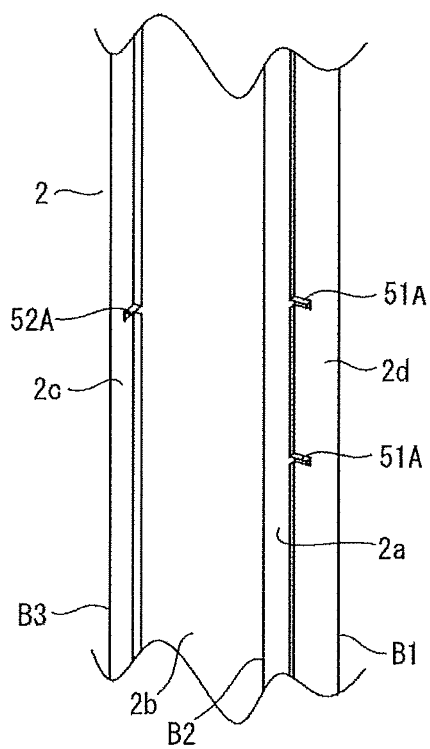
FIG. 12 is a perspective view of a shape of a fitting section to an intermediate frame provided in a frame material in an up-down direction in the frame assembly body according to the fourth embodiment of the invention.
Figure 13:
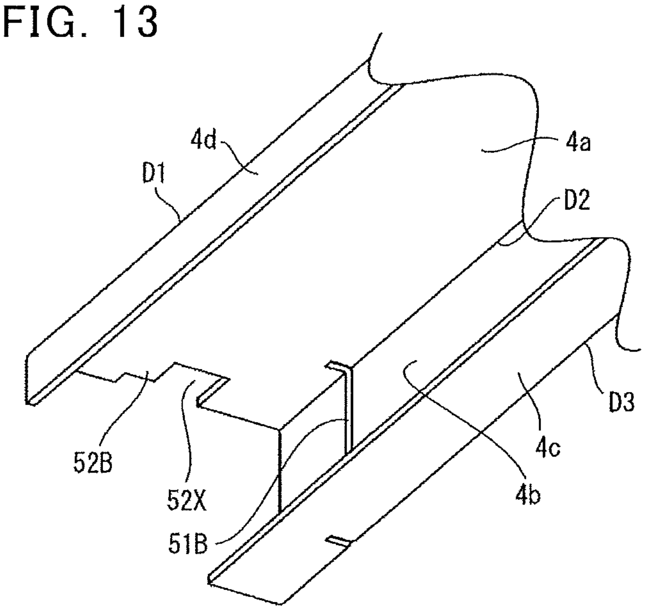
FIG. 13 is a perspective view of a shape of a fitting section to the frame material in the up-down direction, which is provided at a tip of the intermediate frame in the frame assembly body according to the fourth embodiment of the invention.

FIG. 11 to FIG. 16 are views that illustrate a frame assembly body according to a fourth embodiment of the invention, FIG. 11 is a perspective view of the frame assembly body according to the fourth embodiment of the invention, FIG. 12 is a perspective view in which a shape of a fitting section to an intermediate frame, which is provided in a frame material in the up-down direction in the frame assembly body depicted in FIG. 11, is seen obliquely from inside and below, and FIG. 13 is a perspective view in which a shape of a fitting section to the frame material in the up-down direction depicted in FIG. 12, which is provided at a tip of the intermediate frame depicted in FIG. 11, is seen obliquely from inside and below.

Figure 14:
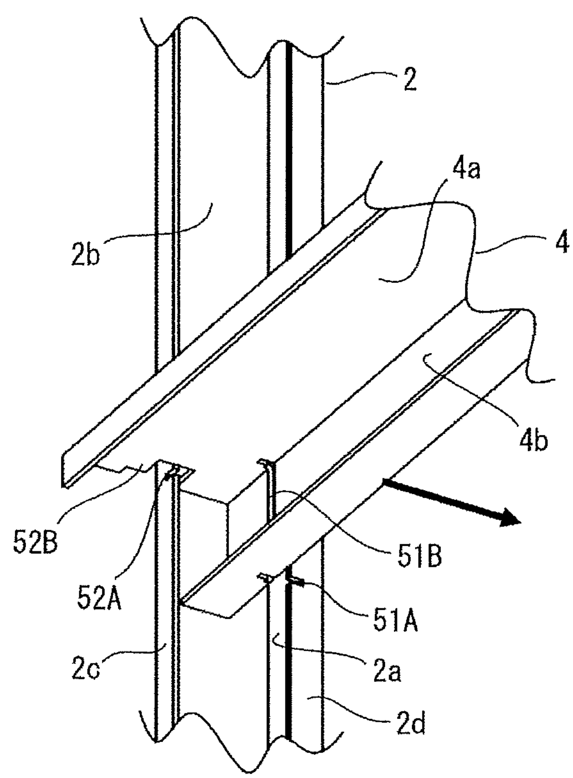
FIG. 14 is a perspective view that illustrates an operation at a time when the intermediate frame is fitted to the frame material in the up-down direction in the frame assembly body according to the fourth embodiment of the invention.
Figure 15:
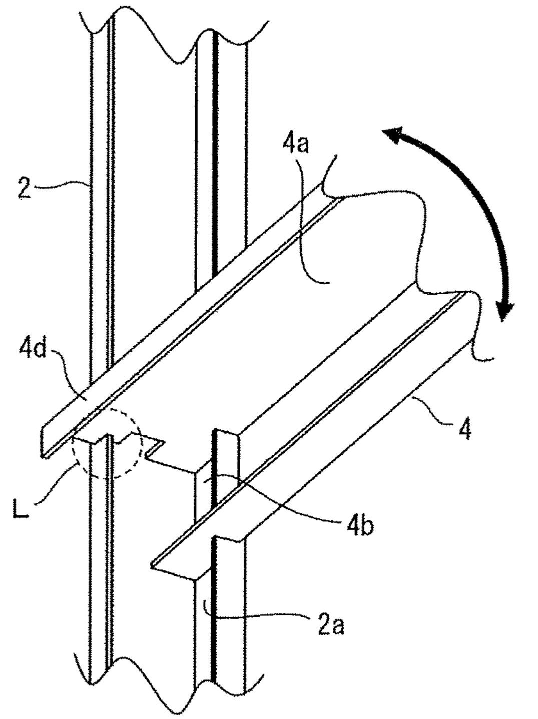
FIG. 15 is a perspective view that illustrates a joined state at a time when the frame material in the up-down direction and the intermediate frame are fitted to each other in the frame assembly body according to the fourth embodiment of the invention.
Figure 16:
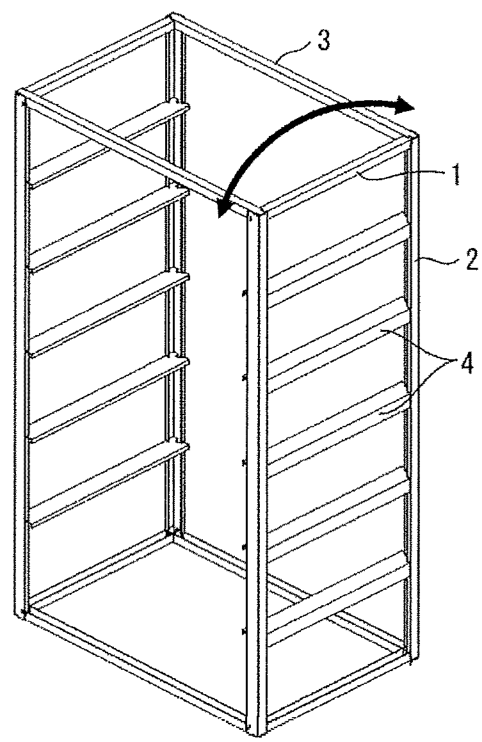
FIG. 16 is a perspective view of a modified example of the frame assembly body according to the fourth embodiment of the invention.

FIG. 14 is a perspective view of the frame assembly body that is seen obliquely from inside and below and that illustrates an operation at a time when the intermediate frame is fitted to the frame material in the up-down direction depicted in FIG. 11, FIG. 15 is a perspective view of the frame assembly body that is seen obliquely from inside and below and that illustrates a joined state at the time when the frame material in the up-down direction depicted in FIG. 14 and the intermediate frame are fitted to each other, and FIG. 16 is a perspective view of a modified example of the frame assembly body according to the fourth embodiment of the invention.

In FIG. 11, an arrow indicates the front side. Similar to the third embodiment, the frame material 1 is disposed in the front-rear direction, and the frame material 3 is disposed in the right-left direction. The frame assembly body is provided with an intermediate frame 4 at a center of the frame material 2 in the up-down direction in a rectangular parallelepiped framework, which is similar to that in the third embodiment depicted in FIG. 9, the intermediate frame 4 being locked to the two frame materials 2, which are aligned in a front-rear section by fitting.

Note that, in this fourth embodiment, while the frame materials 2 are arranged in the up-down direction and are connected by the intermediate frame 4, the invention is not limited thereto. The intermediate frame 4 horizontally connects the two adjacent frame materials disposed in the up-down direction of the frame materials including the frame materials 1, the frame materials 2, and the frame materials 3.

The intermediate frame 4 is formed by bending a steel sheet three times by the press brake and, as depicted in FIG. 13, has three bent sections D1, D2, D3 and four surfaces including an upper surface 4*a*, an outer surface 4*b*, a lower surface 4*c*, and an inner surface 4*d*. As depicted in FIG. 12, in a portion of the frame material 2 surrounded by a circle K in FIG. 11, two horizontal notch slits 51A that are vertically separated from each other are provided on the lateral end surface of the opposing surface 2*d*, and a notch slit 52A is provided on the lateral end surface of the opposing surface 2*c* at the same height as the upper notch slit 51A of the two notch slits 51A.

Meanwhile, as depicted in FIG. 13, a notch slit 51B, a recessed section 52X, and a fitted piece 52B are provided in a portion of the intermediate frame 4 surrounded by the circle K in FIG. 11. The notch slit 51B is formed in the up-down direction across the three surfaces of the upper surface 4*a*, the outer surface 4*b*, and the lower surface 4*c*, a lateral end surface portion of the opposing surface 2*d* between the two notch slits 51A provided in the frame material 2 is inserted therethrough, and the notch slit 51B locks the intermediate frame 4 to the frame material 2. On a longitudinal end surface of the intermediate frame 4, the recessed section 52X allows the opposing surface 2*c* of the frame material 2 to pass therethrough when being mounted. The fitted piece 52B is formed adjacently to the inner surface 4*d* side of the recessed section 52X and is fitted to the notch slit 52A of the frame material 2. Note that the other fitted sections of the intermediate frame 4 to the frame material 2 are configured similarly.

In order to fit the intermediate frame 4 to the frame material 2, as depicted in FIG. 14, after an end of the intermediate frame 4 is inserted in a portion between the first primary surface 2*a* and the back surface side of the second primary surface 2*b* of the frame material 2, the intermediate frame 4 is slid in an arrow direction such that the notch slit 51B of the intermediate frame 4 and the fitted piece 52B of the intermediate frame 4 are respectively fitted to the notch slit 51A of the frame material 2 and the notch slit 52A of the frame material 2 in the up-down direction. The other end side thereof is fitted in a similar manner, and the intermediate frame 4 can thereby be fixed to the frame material 2 of the frame assembly body.

As described above, in a state where the intermediate frame 4 is fixed to the frame material 2 by fitting, as depicted in FIG. 15, the frame material 2 and the intermediate frame 4 are fitted at the two vertically separate positions where the two notch slits 51A of the frame material 2 in the up-down direction are fitted to the notch slit 51B of the intermediate frame 4. In this way, rotation of the other end side of the intermediate frame 4 in an arrow direction of the drawing is suppressed.

In addition, in a portion surrounded by a broken circle L in FIG. 15, the frame material 2 in the up-down direction and the intermediate frame 4 are fitted to each other at the notch slit 52A and the fitted piece 52B. In this way, even when it is desired to place heavy equipment or the like on the intermediate frame 4, for example, a load of the equipment or the like can be received by the fitted section of the notch slit 52A and the fitted piece 52B near the equipment or the like. Accordingly, bending moment applied to the intermediate frame 4 can be reduced. Note that, in order to reliably fix the intermediate frame 4, for example, an abutment portion of the outer surface 4*b* of the intermediate frame 4 against the back-surface side of the first primary surface 2*a* of the frame material 2 may be fixed by the screw, the rivet, or another fixing means such as an adhesive.

Note that the frame assembly body depicted in FIG. 11 can also be configured as that in the modified example of the fourth embodiment depicted in FIG. 16 by increasing the number of the intermediate frames 4. In either case, when a panel, a top board, a door, or the like is assembled to a lateral surface, front/rear surfaces, a top surface, and a bottom surface of the frame assembly body, a casing that accommodates various types of electrical equipment such as a switchboard, electronic equipment, or the like can be obtained. In addition, shelves can be provided by partitioning inside of the casing by using the right and left intermediate frames 4.

The frame assembly body and the casing are assembled by fitting the ends of the plural frame materials. In this way, deformation of the entire frame structure as depicted by an arrow in FIG. 16 can be suppressed. At the same time, the heavy equipment or the like can be installed in the frame structure. It is needless to say that a mounted position and the number of the intermediate frame 4 are appropriately determined in accordance with dimensions, the mounted number, and the like of the equipment that has to be installed therein. In addition, in order to suppress rattling of the fitted sections and make the entire frame structure as a further robust structure, the number of the fastening tools that fasten the fitted sections, such as the screws or the rivets, may be increased when necessary.

As it has been described so far, according to the fourth embodiment, similar to the first to third embodiments, the frame assembly body and the casing can be obtained, the frame assembly body and the casing being able to eliminate the welding work and the coupling member, such as a gusset plate, that couples the frame materials and has the complicated shape, being assembled easily by reducing the number of the fastening tools such as the bolts or the rivets, and securing the sufficient strength.

The intermediate frame 4, which is used to provide the shelf or the like in the casing, is mounted by fitting the two notch slits 51A to the notch slit 51B and fitting the notch slit 52A to the fitted piece 52B. Thus, the easy assembly and the strong connection can be achieved. While the deformation of the entire frame structure is suppressed, the heavy equipment or the like can be installed in the frame structure. Note that each of the embodiments of the invention can freely be combined or appropriately be modified or omitted within the scope of the invention.

REFERENCE SIGNS LIST

1: Frame material
1*a*: Primary surface
1*b*: Opposing surface
1*c*: Opposing surface
2: Frame material
2*a*: First primary surface
2*b*: Second primary surface
2*c*: Opposing surface
2*d*: Opposing surface
3: Frame material
3*a*: Primary surface
3*b*: Opposing surface
3*c*: Opposing surface
4: Intermediate frame
4*a*: Upper surface
4*b*: Outer surface
4*c*: Lower surface
4*d*: Inner surface
5, 5*a*, 5*b*, 5*c*: Screw
11A: Projected piece
11B: Fitting hole
12A: Projected piece
12B: Recessed section
13A: Projected piece
13B: Recessed section
21A: Fitting slit
21B: Notch
22A: Fitting slit
22B: Notch
23A: Fitting slit
23B: Notch
31A: Fitting slit
31B: Projected piece base
41A: Engagement piece
41B: Slit
51A: Notch slit
51B: Notch slit
52A: Notch slit
52B: Fitting piece
52X: Recessed section
A1, A2: Bent section
B1, B2, B3: Bent section
C1, C2: Bent section
D1, D2, D3: Bent section
E1, E2, E3, E4: Projected piece locking section
F1, F2, F3: Slit fitting section
G: Corner
H: Corner
I: End surface
J: End surface

The invention claimed is:

1. A frame assembly body including a first frame and a second frame, each of which has a shape that a plate is bent along a periphery of a square column, has plural bent sections and plural sides continuing from the bent sections, and having a connected section in which one end of the first frame and the second frame are joined perpendicularly, wherein:

the connected section has:

a projected piece locking section in which a slit-shaped through hole and a recessed section formed in the second frame are fitted, respectively, to a first projected piece and a second projected piece provided on end surfaces of the first frame; and a slit fitting section in which a slit-shaped notch formed in the second frame is fitted to a fitting slit formed in a manner to attach the first frame.

2. The frame assembly body according to claim 1 wherein:

the first frame and the second frame each have a longitudinal end surface and a lateral end surface, the longitudinal end surfaces being orthogonal to respective bent sections, the lateral end surfaces are parallel to the respective bent sections, and the longitudinal end surfaces are proximate the connected section, the first frame has two bent sections and three sides, the three sides including first and second sides which are mutually opposed, the first projected piece projects from a longitudinal end surface of the first side, the fitting slit is provided on the lateral end surface of the second side, and an opening of the fitting slit is formed to be widened in a tapered shape in a direction toward the longitudinal end surface of the second side, and the second frame has three bent sections and four sides, the four sides including a first primary side and a second primary side, the second primary side being orthogonal to the first primary side, the through hole is provided on the first primary side, and the slit-shaped notch is provided in a third side of the four sides that opposes the first primary side, the slit-shaped notch encompassing the bent section between the third side and the second primary side.

3. The frame assembly body according to claim 2 wherein:

the second projected piece projects from a longitudinal end surface of a central side connecting the first and second sides, and the second frame has the recessed section on a longitudinal end surface of the first primary side, the recessed section being fitted to the second projected piece.

4. The frame assembly body according to claim 2 wherein:

an exterior surface of the second side of the first frame abuts against an interior surface of the second primary side of the second frame, and the exterior surface of the second side of the first frame and the second primary side are fixed by a fastening tool in an abutted portion.

5. The frame assembly body according to claim 2 further comprising:

a third frame that is formed by sequentially bending a plate perpendicularly along the periphery of the square column and has two bent sections, three sides; and a three-way connected section in which ends of the first frame, the second frame, and the third frame are joined orthogonally in that the three-way connected section has:

slit fitting sections in which the third frame is joined to the first frame and the third frame is joined to the second frame; and a projected piece locking section in which the third frame is joined to the first frame.

6. The frame assembly body according to claim 5 wherein:

the first frame has a second projected piece that projects from a longitudinal end surface of a central side connecting the first and second sides, and the second frame has the recessed section, which is fitted to the second projected piece, on the longitudinal end surface of the first primary side, the third frame includes first and second opposing sides, a third frame primary side connecting the first and second opposing sides, a longitudinal end surface on a side of the third frame with the three-way connected section and a lateral end surface that is parallel to the bent sections, the longitudinal end surface being orthogonal to the bent sections, in the three-way connected section, the third frame has: two fitting slits that are formed on a lateral end surface of the first opposing side; a fitting slit that is formed on a lateral end surface of the second opposing side; and a projected piece that is provided to be projected from a longitudinal end surface of the third frame primary side, the second frame has: a notch in the side opposing the second primary side, the notch being fitted to the fitting slit on a far side from the longitudinal end surface, of the two fitting slits formed on the lateral end surface of the first opposing side of the third frame; and a recessed section on the longitudinal end surface of the second primary side, the recessed section being fitted to the projected piece of the third frame, the first frame has an L-shaped slit that is formed across the first side provided with the first projected piece and across the central side, that is fitted to the fitting slit formed on the second opposing side of the third frame, and through which the second opposing surface on one end side, from the fitting slit to the lateral end surface of the third frame, is inserted, and a portion of the first opposing side of the third frame on one end side from the fitting slit, which is on a far side from the longitudinal end surface of the third frame, is joined in a state of being inserted between an L-shaped longitudinal end surface of the first frame, which is a portion between the first projected piece on the first side of the first frame and the second projected piece of the first frame, and the first primary side of the second frame.

7. The frame assembly body according to claim 5 comprising:

four first frames, four second frames, four third frames; and eight three-way connected sections.

8. The frame assembly body according to claim 7 further comprising:

an intermediate frame horizontally connecting two frames that are disposed in an up-down direction and are adjacent to each other among any of the frames including the first frame, the second frame, and the third frame in that a frame of the two connecting frames has: two horizontal notch slits that are provided on one lateral end surface; and a horizontal notch slit that is provided on the other lateral end surface and is located at a same height as an upper notch slit of the two notch slits on the one lateral end surface, and the intermediate frame has: three bent sections formed by sequentially bending a plate perpendicularly along the periphery of the square column; and four sides; a notch slit that is formed across three sides of the four sides and, through which a lateral end surface portion of the frame between the two notch slits is inserted; and a fitting piece that is fitted to the notch slit provided on the other lateral end surface of the frame.

9. A casing comprising:

the frame assembly body according to claim 5.

* * * * *